United States Patent [19]

Jewer

[11] Patent Number: 4,532,616
[45] Date of Patent: Jul. 30, 1985

[54] METHOD FOR OPTICALLY ENCODING DIGITAL DATA ON A SUBSTRATE AND THE DATA RECORD CARRIER FORMED THEREBY

[75] Inventor: Alan A. Jewer, Whitewater, Wis.

[73] Assignee: News Log International, Inc., Janesville, Wis.

[21] Appl. No.: 384,582

[22] Filed: Jun. 3, 1982

[51] Int. Cl.$^3$ .................... G11B 7/00; G11B 21/00
[52] U.S. Cl. ........................................ 369/44; 369/97
[58] Field of Search ................ 235/436, 454; 365/59, 365/127; 369/44, 97

[56] References Cited

U.S. PATENT DOCUMENTS

| | | | |
|---|---|---|---|
| 3,186,707 | 6/1965 | Banning, Jr. et al. | 274/41.4 |
| 3,198,527 | 8/1965 | Stanton | 274/11 |
| 3,501,586 | 3/1970 | Russell | 178/6.7 |
| 3,543,007 | 11/1970 | Brinker | 235/436 |
| 3,549,826 | 12/1970 | Browning | 179/100.3 |
| 3,624,284 | 11/1971 | Russell | 178/6.7 A |
| 3,675,930 | 7/1972 | Summerfield | 274/11 R |
| 3,795,902 | 3/1974 | Russell | 340/173 LM |
| 3,806,643 | 4/1974 | Russell | 178/6.7 R |
| 3,885,094 | 5/1975 | Russell | 178/7.6 |
| 3,891,794 | 6/1975 | Russell | 178/6.7 R |
| 3,898,629 | 8/1975 | Westerberg | 365/127 |
| 3,919,697 | 11/1975 | Walker | 340/173 R |
| 3,961,315 | 6/1976 | Yokoyama | 365/127 |
| 4,090,031 | 5/1978 | Russell | 358/130 |
| 4,102,569 | 7/1978 | Schwartz | 353/120 |
| 4,163,600 | 8/1979 | Russell | 350/6.7 |
| 4,213,040 | 7/1980 | Gokey et al. | 235/476 |
| 4,410,877 | 10/1983 | Carasso et al. | 340/347 DD |

Primary Examiner—Harold I. Pitts
Attorney, Agent, or Firm—Thomas R. Vigil

[57] ABSTRACT

A method for optically encoding digital data (12) on a substrate (11) without timing or synchronization data to form a data record carrier (10) includes the steps of: selecting a track (14) path on the substrate (11); selecting a data cell length (L) in the direction of the track (14) for each bit of data to be stored in each cell (15) on each track (14); selecting a cell width dimension (W) transverse to the direction of the track (14); selecting an optical non-transition cell (15) for one form of logic (0 or 1) to be stored in each such non-transition cell (15); selecting an optical transition cell (15) for the other form of logic (1 or 0) to be stored in each such other transition cell (15); creating at least one track (14) of digital data (12) on the substrate (11) comprised of a series of cells (15) each having the same cell length (L) in the direction of the track (14); establishing in each non-transition cell (15) on the substrate (11) a fully reflective or transmissive surface or a fully non-reflective or non-transmissive surface; establishing in each transition cell (15) on the substrate (11) a reflective or transmissive surface over part of the cell (15) extending transverse to the direction of the track (14) and a non-reflective or non-transmissive surface over the other part of the cell (15) extending transverse to the direction of the track (14) and creating a plurality of arcuate tracks (14) of cells (15) on the substrate (11) with each track (14) being spaced from an adjacent track (14) by a predetermined distance at a point intermediate the ends of each track (14) and each track (14) having the same radius throughout the arcuate path of said track (14) such that the tracks (14) extend in an arcuate manner across the data record carrier (10) with each track (14) having the same radius and being arranged in a nested manner relative to adjacent tracks (14) along a common centerline.

61 Claims, 4 Drawing Figures

METHOD FOR OPTICALLY ENCODING DIGITAL DATA ON A SUBSTRATE AND THE DATA RECORD CARRIER FORMED THEREBY

CROSS REFERENCE TO RELATED APPLICATIONS

This application is related to U.S. application Ser. No. 625,573 filed June 28, 1984 and entitled: A DIGITAL DATA RECORD, which is a continuation of U.S. application Ser. No. 290,475 filed on Aug. 6, 1981, which is a continuation-in-part application of earlier U.S. application Ser. No. 181,782 filed on Aug. 25, 1980.

BACKGROUND OF THE INVENTION

1. Field of the Invention

The present invention relates to a method for optically encoding digital data in the form of logic bits of binary data in cells along a track on a substrate and the data record carrier formed thereby. More specifically, the present invention relates to the storing of digital data in cells having specific dimensions with the stored data in each cell being in the form of an optical transition or non-transition in the cell and with the cells being located in arcuate tracks of equal radii that are arranged in an equally spaced, nested array.

2. Description of the Prior Art

Heretofore it has been proposed in U.S. Pat. No. 4,213,040 to encode digital information in rows and columns on a record carrier. Data is read from the record carrier by movement of the record carrier on an X axis and rotation transport mechanism which is operable to make skew corrections.

Also heretofore various optical encoded data record carriers and optical "writers" and "readers" have been proposed. For example, in U.S. Pat. No. 3,549,897 there is disclosed an absolute electro-optical encoder for indicating the angular position of a shaft. The encoder includes a stationary disc and a rotary disc, the discs having concentric tracks with transmissive and non-transmissive portions which are binarily related. Light passing through the discs is picked up by certain selected combinations of photocells for indicating the position of one disc relative to the other disc.

In U.S. Pat. Nos. 3,501,586; 3,624,284; 3,885,094; 3,795,902; 3,806,643; 3,891,794; 4,090,031 and 4,163,600 issued to J. Russell, various "writers" and "readers" are disclosed for "writing" digital data on a spiral track and for "reading" digital data from the spiral track. In the optical encoding and decoding systems described in these patents opaque spots on the track correspond to logic 1 bits of binary data and transparent spots on the track correspond to logic 0 bits of binary data. Also, larger synchronization spots are provided at different places along the track.

An apparatus for scanning a data record medium is disclosed in U.S. Pat. No. 3,898,629 wherein binary digital information is recorded in the form of data along a circular arc and a plurality of such circle arcs of data information are arranged tightly adjacent each other.

In U.S. Pat. No. 3,919,697 there is disclosed a data record having track lines which may be separate parallel tracks or may be a single series track of the spiral or raster type.

In U.S. Pat. No. 3,983,317 there is disclosed an astigmatizer for a laser recording and reproducing system. In this system concentric circular tracks are formed in a thermoplastic record or disc by burning selected holes through the disc with a laser. The laser is "on" while the disc is being rotated a short distance to form an elongate data information bit in the track. Then, in reading the data the laser beam or spot is elongated in a direction transverse to the direction of the track with an astigmatizer unit so that a small elongate beam of light with an axis extending transverse to the axis of the track and of the elongate opening therein is used to read the opening.

In U.S. Pat. No. 4,094,010 there is disclosed an optical multi-channel digital disc storage system. Data is stored on a spiral information track and holes corresponding to the information data are burned into the material of the disc by an information radiation beam.

U.S. Pat. No. 4,094,013 discloses an optical storage disc system with disc track guide sectors wherein the data tracks are spiral shaped turns or concentric turns on the disc. The data stored is again in the form of holes burned into the disc.

U.S. Pat. No. 4,209,804 discloses a record carrier containing information in an optically readable radiation reflecting information structure. With the record carrier of this patent, data is stored in a spiral track on a disc in the form of information areas comprising pits pressed into the record carrier surface or hills projecting from the record carrier surface. According to the teachings of this patent, the depth of the pits or the height of the hills is constant and so is the width of the information areas and intermediate areas at the level of the plane of the lands. Then the information to be conveyed by the record carrier is contained in the variation of the structure of the areas in the tangential direction only. More specifically, the information areas are substantially V-shaped, the phase depth of each information area having one value between 100° and 120° and the angle of inclination between the walls of the information areas and normal to the record carrier are substantially constant and have a value between 65° and 85°.

As will be described in greater detail hereinafter, the present invention differs from the record media and carriers disclosed in the prior art patents referred to above by providing a method for optically encoding binary/digital data on a substrate of a record carrier wherein the data cells containing bits of data are closely compacted by having the data stored in each data cell in the form of an optical transition or non-transition over the length of the cell in arcuate data tracks all having the same radius and being arranged in a nested, equally spaced apart array of tracks which are non-spiral and where the tracks are not arcs of concentric circles. The non-transition cells are cells which are completely transmissive or completely non-transmissive in one embodiment or completely reflective or completely non-reflective in another embodiment. The transition cells are partially transmissive and partially non-transmissive in one embodiment and partially reflective and partially non-reflective in another embodiment.

The change in transmissiveness or reflectance occurs in a direction along the length of the cells and in the direction of the track such that there is a transition as a scanning or reading head comprised of a light source and a light sensor which picks up transmitted or reflected light travels along the length of the track.

The simple method disclosed herein for optically encoding data on a substrate and the data record carrier formed thereby enable one to compact data very closely on the track and such data encoding is highly tolerant of noise, i.e., in the sharpness or fuzziness of the cell edge, to the location of the edge of a cell or to the position of a transition within a cell.

Typically, the non-occurrence of a transition over the length of a cell on a track corresponds to a logic 0 bit of information and the occurrence of a transition across the length of the cell corresponds to a logic 1 bit of information, it being understood that the reverse encoding or decoding will work as well.

Further, a plurality of arcuate tracks of the cells are created on the substrate with each track being spaced from an adjacent track by a predetermined distance at a point intermediate the ends of each track, and each track has the same radius throughout the arcuate path of the tracks such that the tracks extend in an arcuate manner across the data record carrier with each track having the same radius and being arranged in a nested manner relative to adjacent tracks along a common centerline.

SUMMARY OF THE INVENTION

According to the invention there is provided a method for optically encoding digital data on a substrate without timing or synchronization data to form a data record carrier including the steps of: selecting an arcuate track path on the substrate; selecting a data cell length in the direction of the track for each bit of data to be stored in each cell on each track; selecting a cell width dimension transverse to the direction of the track; selecting a non-transition cell for one form of logic (0 or 1) to be stored in each such cell; selecting a transition cell for the other form of logic (1 or 0) to be stored in each such other cell; creating at least one track of digital data on the substrate comprised of a series of cells each having the same cell length in the direction of the track; establishing in each non-transition cell on the substrate a fully reflective surface or fully non-reflective surface; establishing in each transition cell on the substrate a reflective surface over part of the cell extending transverse to the direction of the track and a non-reflective surface over the other part of the cell extending transverse to the direction of the track, and creating a plurality of arcuate tracks of cells on said substrate with each track being spaced from an adjacent track by a predetermined distance at a point intermediate the ends of each track and each track having the same radius throughout the arcuate path of said track such that the tracks extend in an arcuate manner across the data record carrier with each track having the same radius and being arranged in a nested manner relative to adjacent tracks along a common center line.

Further according to the invention there is provided a method for optically encoding digital data on a substrate without timing or synchronization data to form a data record carrier including the steps of: selecting an arcuate track path on the substrate; selecting a data cell length in the direction of the track for each bit of data to be stored in each cell on each track; selecting a cell width dimension transverse to the direction of the track; seleoting a non-transition cell for one form of logic (0 or 1) to be stored in such cell; selecting a transition cell for the other form of logic (1 or 0) to be stored in such other cell; creating at least one track of digital data on the substrate comprised of a series of cells each having the same cell length in the direction of the track; establishing in each non-transition cell in the substrate a fully transmissive area or a fully non-transmissive area; establishing in each transition cell in the substrate a transmissive area over part of the cell extending transverse to the direction of the track and a non-transmissive area over the other part of the cell extending transverse to the direction, and creating a plurality of arcuate tracks of cells on said substrate with each track being spaced from an adjacent track by a predetermined distance at a point intermediate the ends of each track and each track having the same radius throughout the arcuate path of said track such that the tracks extend in an arcuate manner across the data record carrier with each track having the same radius and being arranged in a nested manner relative to adjacent tracks along a common center line.

Still further according to the invention there is provided a data record carrier without timing or synchronization data including a substrate and digital data on the substrate in the form of a plurality of arcuate tracks of cells on said substrate with each track being spaced from an adjacent track by a predetermined distance at a point intermediate the ends of each track and each track having the same radius throughout the arcuate path of said track such that the tracks extend in an arcuate manner across the data record carrier with each track having the same radius and being arranged in a nested manner relative to adjacent tracks along a common center line, one bit of data (0 or 1) being stored in each cell, each cell having the same cell length in the direction of the track and the same cell width in a direction transverse to the direction of the track, and each cell for one form of logic (0 or 1) being a non-transition celln and each cell for the other form or logic (1 or 0) being a transition cell.

DESCRIPTION OF THE PREFERRED EMBODIMENT

Figure 1:
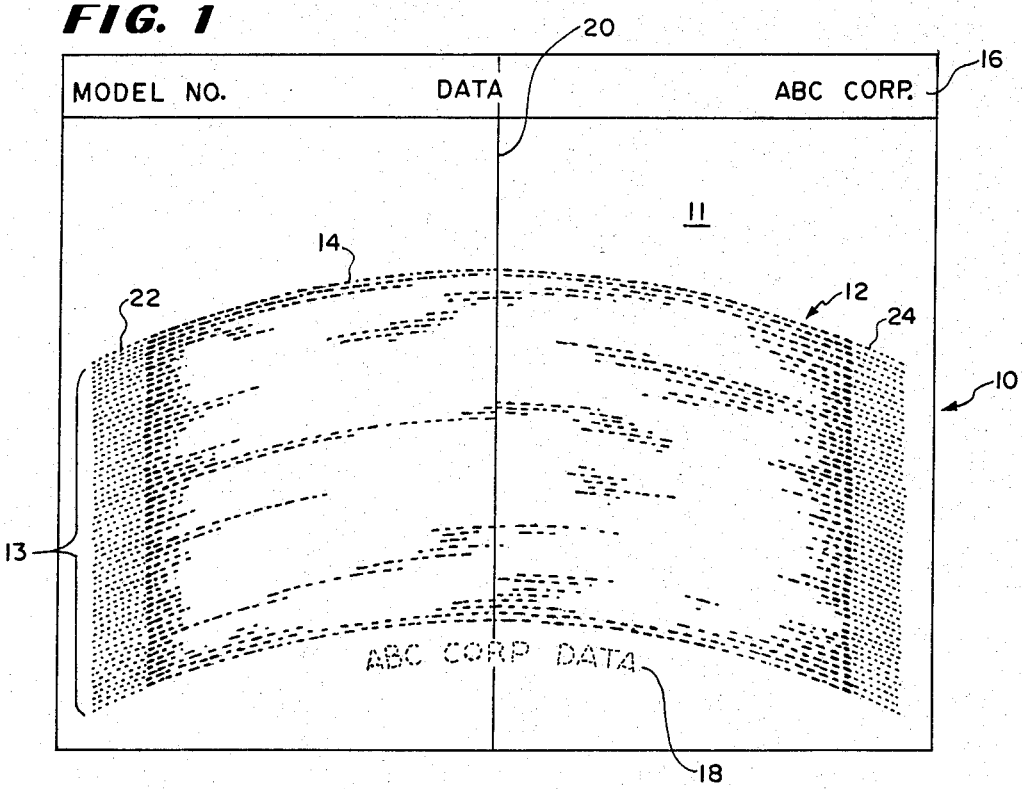
FIG. 1 is a plan view of a data record carrier constructed and arranged in accordance with the teachings of the present invention.

Referring now to the drawings in greater detail there is illustrated in FIG. 1 a data record carrier 10 constructed in accordance with the teachings of the present invention. The data record carrier 10 includes a substrate 11 which can be made from a number of different materials. For example, it can be made from paper, paperboard, coated enamel paper, plastic filament paper, Mylar TM, Kodalith Pan TM, Tri-X Pan TM, Plus-X Pan TM, dry silver, Tri-X TM, Plus-X TM, diazol, or vesicular materials.

In one preferred embodiment, the substrate 11 is made of a film negative material and a mask or master negative data record carrier 10 is made photographically. The data 12 is represented by transparent or clear areas and dark or opaque areas. A preferred size of this master negative is approximately 4 inches by 6 inches, which is the standard size for microfiche negatives.

Once a mask or film negative data record carrier 10 has been made, such negative or mask can be reproduced or utilized for printing inexpensive data record carriers 10 on an inexpensive substrate 11 material such as paper or paperboard materials.

In the case of a data record carrier 10 which has a substrate 11 made from film negative material, data 12 is optically encoded therein in the form of a plurality 13 of tracks 14 utilizing photographic techniques.

In this respect, and as will be described in greater detail hereinafter, a camera is utilized to create cells 15 (FIGS. 2 and 3) in each track 14 where each cell 15 has a predetermined length L (FIG. 2) along the direction of the track and a predetermined width W (FIGS. 2 and 3) transverse to the direction of the track 14. Each cell 15 is transparent or opaque or portions thereof are transparent or opaque to define a certain logic state in the cell in accordance with the teachings of the present invention and as will be described in greater detail hereinafter.

Once a mask or master film negative form of data record carrier 10 is made, such a mask can be utilized for the printing of data record carriers 10 on a paper or paperboard substrate 11.

When the data 12 is printed, the cells 15 are either reflective or non-reflective or partially reflective and partially non-reflective to represent different logic states, namely logic 0 or logic 1.

The substrate 11 can also have printed thereon other pertinent data in a header section 16.

In the embodiment shown in FIG. 1, the data record carrier 10 shown is utilized for storing information relating to a parts list, price list, and other pertinent data relative to a product sold under a particular model number by a particular company. Other data or a repeat of the data in the header section 16 can also be printed on the substrate 11 beneath the data 12 in the same manner the cells 15 of each track 14 are printed as shown at 18 in FIG. 1.

Figure 3:
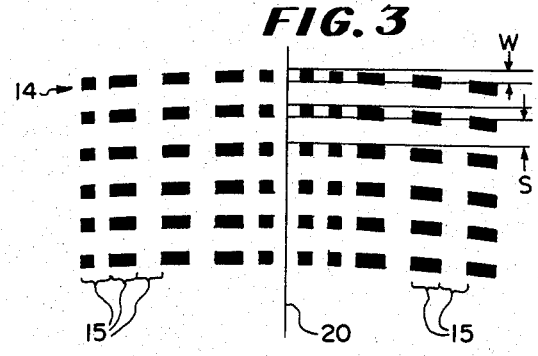
FIG. 3 is an enlarged view of the center portion of the data tracks shown in FIG. 1.

As will be described further in connection with the description of FIGS. 3, 4, and 5, when the data record carrier 10 is formed on a film negative substrate 11, each cell 15 having a given cell length L and a given cell width W that will represent one form of logic, logic 0 or logic 1, will be completely transparent or completely opaque. In other words, there will be no transition across the length of the cell and such cell is referred to as a non-transition cell and in this description will correspond to a logic 0 data bit.

Then, for adjacent cells, which will be characterized as containing a logic 1 data bit, part of the cell extending in a direction transverse to the direction of the track 14 will be opaque and the remaining part of the cell extending transverse to the direction of the track 14 will be transparent or vice versa. As a result, there is a transition intermediate and typically midway across the length L of the cell 15 from transparent to opaque or opaque to transparent. As a result, an optical reader having a light source which passes light directly, or via fiber optics, to the substrate 11 of the data record carrier 10 as the reader is moving arcuately along a track 14 will sense no transition along a cell 15 length L but will sense a transition (opaque to transparent or vice versa) when there is a transition intermediate the edges of a cell 15. Such optical information is converted to electrical signals by a photosensor moving with the reading head and sent to a microprocessor which has been programmed to sense when there has been a transition over a cell length and when there has not been a transition over the length of a cell 15 and to then generate a corresponding logic 0 or logic 1 data bit of information which is supplied to a random access memory.

It is important to note, however, that according to the teachings of the present invention, data is encoded in the form of a transition or a non-transition in each cell 15 so that there is no lost space between cells 15 and cells 15 can be made as small as present technology permits.

Referring again to FIG. 1, it will be apparent that each of the tracks 14 is arcuate and such tracks are created by moving a camera in an arcuate path. As taught in copending U.S. application Ser. No. 625,573 filed June 28, 1984 and entitled: A DIGITAL DATA RECORD which is a continuation of application Ser. No. 290,475, filed Aug. 6, 1981, and entitled: A DIGITAL DATA RECORD, each of the tracks 14 has the same radius and this radius is constant over the length of the track 14. Also, each track 14 of the plurality 13 of tracks 14 are spaced apart from one another a predetermined distance S (FIG. 3) with each track 14 extending in an arcuate manner across the substrate 11 of the data record carrier 10 so as to be arranged in a nested manner, again with each track 14 having the same radius.

In this way, the data record carrier 10 can be positioned on a carrier or transporter of a reader and once proper alignment has been obtained, the data record carrier 10 can be indexed along an axis 20 which is colinear with a line that extends across the data record carrier 10 and is colinear with a radius of each data track 14.

In reading data from the data record carrier 10, a rotating reader or scanner head will rotate over the first track 14 on a rotation thereof picking up and reading the data encoded on the track 14 and then while the reading head or scanner is completing a revolution around its rotating axis, the data record carrier 10 is indexed along the line or axis 20 a distance S from the first track 14 to the second track 14 and so on for each successive track 14.

When the data record carrier 10 substrate 11 is made of a non-energy transmissive material, such as a paper or paperboard material, and the data 12 is optically encoded in the cells 15 by forming a non-transition logic 0 cell 15 with a fully reflective or fully non-reflective surface and a transition logic 1 cell 15 with a portion of the cell 15 being reflective and another portion being non-reflective, then the reader will be of the type which directs light onto the surface of the data record carrier 10 and which has a sensor adjacent the point of light emission for sensing reflected light from reflective areas.

From empirical tests and experiments with different substrate materials, different sizes of substrates, different cell widths, different cell lengths, and different radii for the tracks, a number of parameters have been determined. For example, it has been determined that a very useable data record carrier 10 is provided when the track 14 radius is between 4 and 18 inches and that a preferred radius for each track 14 is somewhere between 8 and 12 inches.

Also it has been determined empirically that for a track 14 radius of between 4 and 18 inches the arc subtended by the track can be between 120° and 30°.

More specifically, for tracks 14 having a radius of somewhere between 8 and 12 inches, a preferred arc subtended by the track 14 is 60° wherein at least 45° of the arc of the track 14 contains information data.

Figure 2:
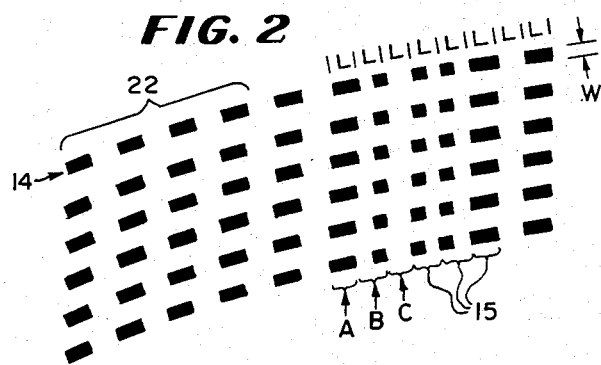
FIG. 2 is an enlarged view of the upper left hand corner of the data tracks formed on and in the substrate of the data record carrier shown in FIG. 1.

Referring now to FIG. 2 there is illustrated therein the beginning of the first six tracks 14 shown at the upper left hand corner of the plurality 13 of tracks 14 on the substrate 11 of the data record carrier 10 in FIG. 1.

Typically, at the beginning and at the end of each track 14, a leader 22 and a trailer 24 are provided, each composed of a series of non-transition logic 0 cells 15 where no transition occurs across the length L of each cell 15. Thus, the length L of the cell 15 would be fully non-reflective (or opaque) or fully reflective (or transparent) and would alternate that way until an address portion of the track 14 is reached.

As shown in FIG. 2, the beginning of the track address is shown with four logic 0 cells, the first one being a fully transparent (or transmissive) cell 15, the next one being a fully non-reflective (or opaque) cell 15, etc. through four cells 15 to cell A. Then there is shown a transition cell B which has the first portion thereof reflective (transmissive) and a second portion thereof non-reflective (opaque). The next cell C is a logic 0 cell and is fully reflective (or transmissive). The succeeding cells 15 are a transition cell the first portion of which is non-reflective (opaque) and the second portion of which is reflective (transmissive) followed by another transition cell 15 and then two non-transition cells 15.

It has been determined empirically that a useful cell length L for optically encoded data is between 0.002 inch and 0.020 inch. A cell length L which is preferred with respect to high compacting of data and which provides a sufficient cell length to facilitate encoding and reading of the data 12 is approximately 0.006 inch. The width W of each cell 15, which is not drawn to scale in FIGS. 2 and 3, can be between 0.003 inch and 0.010 inch. A very suitable cell width dimension W in the direction extending transverse to the direction of the track has been found to be somewhere between 0.006 inch and 0.008 inch.

It also has been found empirically that a very suitable spacing for the nested arcuate tracks 14 is a dimension which is 0.001 or 0.002 inch greater than the width W.

Thus, the spacing S taken along the center line or axis 20 on which the tracks 14 are arranged or nested as shown in FIG. 1 is ideally 0.007 to 0.010 inch.

It will be appreciated that the spacing between the tracks 14 at the beginning of the tracks 14 and at the ends of the tracks 14 will be less than the spacing S in the middle along line 20. In fact, if one were to extend the tracks 14 another 60°, a total of 90° from either side of the line 20, they would converge toward each other and eventually intersect. Thus, although the arcuate tracks 14 appear to be parallel spaced, they are, in reality, equal radii tracks that are arranged in a nested array with a spacing in a preferred embodiment of between 0.007 and 0.010 inch from each other at the place (along the line 20) of maximum spacing.

Figure 4:
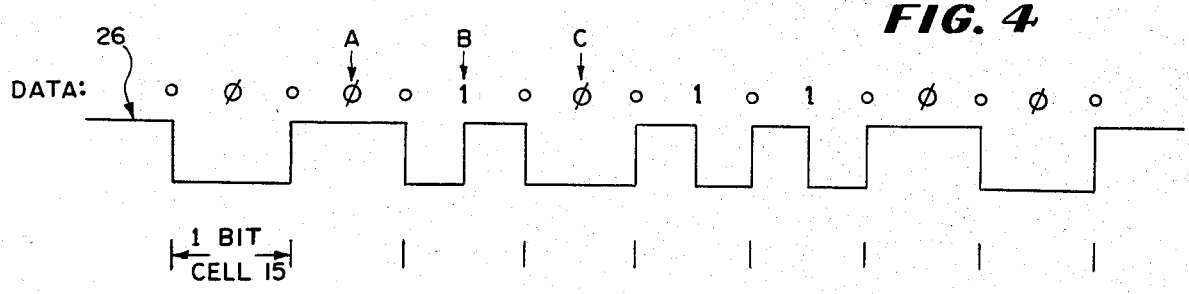
FIG. 4 is a graph of the electrical signal generated by the light energy transmitted or reflected or not transmitted or not reflected across each cell of part of a track shown in FIG. 2 with the corresponding logic state stored in the cell indicated thereabove.

In FIG. 4 is shown a waveform 26 of the electrical signal generated from an optical reading of the data in the first track 14 shown in FIG. 2. Here it is apparent that a fully transmissive or reflective cell 15 and a fully non-transmissive or non-reflective cell 15 corresponds to a data bit of logic 0 in that cell 15. Thus, starting with a first cell 15 which is identified as cell A, there is a fully non-transmissive (opaque) or fully non-reflective surface thereon on substrate 11 such that there is no transition across the length L of the cell as a reader passes along that track 14 over that cell A and the logic of that data bit is logic 0.

Then, the next cell B is partially transmissive or reflective and partially non-transmissive or non-reflective so as to cause a square waveform in signal 26 for cell B. This corresponds to a logic 1 data bit as shown. The next cell C is a non-transition cell C which is fully transmissive or fully reflective. The succeeding cells 15 shown in FIG. 4 are transition, transition, non-transition, non-transition and non-transition.

It is to be appreciated that by establishing logic in the form of a transition or non-transition over a given cell length L, such as a cell length of 0.006 inch, the optically encoded data 12 in the tracks 14 on or in the substrate 11 of the data record carrier 10 can have a wide degree of tolerance with respect to the sharpness or fuzziness of cell edges or the point of transition in the cell 15. In other words, the data 12 can be tolerant of a lot of noise. In this respect, it is not essential that a transition take place within a very confined area of the cell length L. As a result, the position of the cell edge or the position of a transition in a cell or the sharpness of either can vary up to at least 25% of the desired intended location of the cell edge or transition with the data still being highly readable. In this respect, the beginning of the non-reflective area of cell A could be 25% to the left or right of the beginning edge of cell A and the optical sensing and resulting electrical signal generated by the optical sensing would still be able to indicate to a microprocessor that there was no transition over the major length of the cell and that therefore the data bit stored in cell A is logic 0.

Likewise, if the transition in a transition cell such as the cell B occurs somewhere to the right or left of the middle of the cell B, up to at least 25% on either side of the middle of cell B, there will still be a transition over the length L (timewise and distancewise) of cell B to indicate to a microprocessor that a logic 1 data bit is stored in cell B.

As a result, by utilizing the optical transition or non-transition across a cell length L for encoding logic values in the cells 15, i.e., a logic 0 or logic 1, a very efficient and effective data record carrier 10 is provided.

Further in this regard, cell spacing is not required since the microprocessor is only concerned with the transition. Thus a series of logic 0 cells 15 are defined by alternating fully reflective (transmissive) and fully non-reflective (non-transmissive) cells 15 and transition cells 15 for the other form of logic, namely logic 1, are identified by any cell where there is a transition between a reflective (transmissive) and a non-reflective (non-transmissive) area within a cell 15 across the length L of the cell 15.

Additionally, and as noted above, since transitions are being sensed within a cell 15, the cell edge for a non-transition cell 15 or the position of transition within a cell 15 for a transition cell 15 need not be precise and fuzziness and inaccuracy in the position of such transition can be tolerated at least up to 25% of the intended location of the cell edge or position of transition within the cell 15. This makes the optically encoded data very tolerant to noise and very tolerant of errors in printing, or even inaccuracies in the location of printing of a cell edge or transition in a cell 15. The data record carrier 10 is also tolerant of substrate dimensional changes, such as, but not limited to, thermal, chemical or mechanical changes. It is also tolerant of localized or universal changes to the substrate such as, for example, changes due to moisture.

In practicing the method of the present invention in creating a data record carrier 10 one will first select a track path on the substrate 11 which is defined by the radius of the track 14 and the arc to be subtended by the track 14.

Next a cell length L in the direction of the track 14 is selected for each bit of data to be stored in each cell 15 on each track 14. Then a cell width or track width dimension W transverse to the direction of the track 14 is selected.

Then, one selects a non-transition cell 15 for one form of logic, such as logic 0, to be stored in each non-transition cell 15 and a transition cell 15 for the other form of logic, e.g., logic 1, to be stored in each other transition cell for the other form of logic, e.g., logic 1.

Next, depending upon the data to be encoded, a computer associated with a camera for making a data record carrier 10 on film negative material is programmed to direct or not direct a light beam, such as a laser light beam, onto the film negative emulsion while the camera is rotating through the specified arc to be subtended by the track 14.

After a first track 14 is formed or encoded, the camera is indexed a track spacing S and the above procedure is repeated.

In practicing the method for printing a data record carrier 10 of alternating reflective and non-reflective areas for cells 15 on a substrate 11, a mask or master film negative is utilized to print alternating dark or non-reflective areas and light or reflective areas on the paper substrate 11.

Also it is to be noted that it is immaterial whether the printing is identical to the negative or the reverse of the negative since it is the occurrence of a transition over a cell length L which is important and not whether the cell 15 is light (white) or dark, i.e., reflective or non-reflective.

From the foregoing description it is apparent that the method for forming a data record carrier 10 and the data record carrier 10 formed thereby have a number of advantages, some of which have been described above and others of which are inherent in the invention.

Also from the foregoing description it will be apparent to those skilled in the art that modifications may be made to the data record carrier 10 of the present invention without departing from the teachings of the present invention. Accordingly, the scope of the invention is only to be limited as necessitated by the accompanying claims.

I claim:

1. A method for optically encoding digital data on a substrate without timing or synchronization data to form a data record carrier including the steps of: selecting an arcuate track path on the substrate; selecting a data cell length in the direction of the track for each bit of data to be stored in each cell on each track; selecting a cell width dimension transverse to the direction of the track; selecting a non-transition cell for one form of logic (0 or 1) to be stored in each such cell; selecting a transition cell for the other form of logic (1 or 0) to be stored in each such other cell; creating at least one track of digital data on the substrate comprised of a series of cells each having the same cell length in the direction of the track; establishing in each non-transition cell on the substrate a fully reflective surface or fully non-reflective surface; establishing in each transition cell on the substrate a reflective surface over part of the cell extending transverse to the direction of the track and a non-reflective surface over the other part of the cell extending transverse to the direction of the track, and creating a plurality of arcuate tracks of cells on said substrate with each track being spaced from an adjacent track by a predetermined distance at a point intermediate the ends of each track and each track having the same radius throughout the arcuate path of said track such that the tracks extend in an arcuate manner across the data record carrier with each track having the same radius and being arranged in a nested manner relative to adjacent tracks along a common centerline.

2. The method of claim 1 wherein the length of each cell in the direction of the track is between 0.002 inch and 0.020 inch.

3. The method of claim 2 wherein said cell length is approximately 0.006 inch.

4. The method of claim 1 wherein the width dimension of each cell in a direction transverse the direction of the track is between 0.003 inch and 0.010 inch.

5. The method of claim 4 wherein said cell width dimension is approximately 0.006 to 0.008 inch.

6. The method of claim 1 wherein each track is an arcuate track having a given radius that is constant for the length of the arcuate track.

7. The method of claim 6 wherein said constant radius of each arcuate track is between 4 inches and 18 inches.

8. The method of claim 6 wherein said constant radius of each track is approximately 8 to 12 inches.

9. The method of claim 6 wherein the spacing between adjacent tracks is 0.001 to 0.002 inch less than the thickness of each track.

10. The method of claim 9 wherein each track has a thickness of approximately 0.006 to 0.008 inch.

11. The method of claim 1 wherein each track extends between 30° and 120° of arc.

12. The method of claim 11 wherein each said track extends approximately 60° of arc.

13. The method of claim 12 wherein at least 45° of arc of each track contains information data.

14. The method of claim 1 wherein said substrate is approximately 4 inches by 6 inches in size.

15. The method of claim 1 wherein the non-occurrence of a transition over the length of a cell establishes the logic of a non-transition cell (0 or 1) and the occurrence of a transition over the length of a transition cell establishes the logic of the cell (1 or 0) whereby high accuracy in the cell edges or high accuracy in the position of the transition in the transition cells is not required.

16. The method of claim 15 wherein the cell edges or the position of the transition of a cell or the sharpness of either can vary up to at least 25% of the desired intended location (position along the track) of such cell edge or position of transition with the data still being highly readable.

17. The method of claim 1 wherein said substrate is made of a stiff but flexible material.

18. The method of claim 1 wherein said substrate is made of paper.

19. The method of claim 17 wherein said step of creating said track is accomplished by printing each track on the paper substrate.

20. A method for optically encoding digital data on a substrate without timing or synchronization data to form a data record carrier including the steps of: selecting an arcuate track path on the substrate; selecting a data cell length in the direction of the track for each bit of data to be stored in each cell on each track; selecting a cell width dimension transverse to the direction of the track; selecting a non-transition cell for one form of logic (0 or 1) to be stored in such cell; selecting a transition cell for the other form of logic (1 or 0) to be stored in such other cell; creating at least one track of digital data on the substrate comprised of a series of cells each having the same cell length in the direction of the track; establishing in each non-transition cell in the substrate a fully transmissive area or a fully non-transmissive area; establishing in each transition cell in the substrate a transmissive area over part of the cell extending transverse to the direction of the track and a non-transmissive area over the other part of the cell extending transverse to the direction, and creating a plurality of arcuate tracks of cells on said substrate with each track being spaced from an adjacent track by a predetermined distance at a point intermediate the ends of each track and each track having the same radius throughout the arcuate path of said track such that the tracks extend in an arcuate manner across the data record carrier with each track having the same radius and being arranged in a nested manner relative to adjacent tracks along a common centerline.

21. The method of claim 20 wherein the length of each cell in the direction of the track is between 0.002 inch and 0.020 inch.

22. The method of claim 21 wherein said cell length is approximately 0.006 inch.

23. The method of claim 20 wherein the width dimension of each cell in a direction transverse to the direction of the track is between 0.003 inch and 0.010 inch.

24. The method of claim 23 wherein said cell width dimension is approximately 0.006 to 0.008 inch.

25. The method of claim 20 wherein each track is an arcuate track having a given radius that is constant for the length of the arcuate track.

26. The method of claim 21 wherein said constant radius of each arcuate track is between 4 inches and 18 inches.

27. The method of claim 21 wherein said constant radius of each track is approximately 8 to 12 inches.

28. The method of claim 21 wherein the spacing between adjacent tracks is 0.001 to 0.002 inch less than the thickness of each track.

29. The method of claim 28 wherein each track has a thickness of approximately 0.006 to 0.008 inch.

30. The method of claim 20 wherein each track extends between 30° and 120° of arc.

31. The method of claim 30 wherein each said track extends approximately 60° of arc.

32. The method of claim 31 wherein at least 45° of arc of each track contains information data.

33. The method of claim 20 wherein said substrate is approximately 4 inches by 6 inches in size.

34. The method of claim 20 wherein the non-occurrence of a transition over the length of a cell establishes the logic of a non-transition cell (0 or 1) and the occurrence of a transition over the length of a transition cell establishes the logic of the cell (1 or 0) whereby high accuracy in the cell edges or high accuracy in the position of the transition in the transition cells is not required.

35. The method of claim 34 wherein the cell edges or the position of the transition of a cell or the sharpness of either can vary up to at least 25% of the desired intended location (position along the track) of such cell edge or position of transition with the data still being highly readable.

36. The method of claim 20 wherein said substrate is made of a stiff but flexible material.

37. The method of claim 36 wherein said substrate is made of a photosensitive material.

38. The method of claim 37 wherein said step of creating each track of digital data on the substrate is accomplished by photographic techniques.

39. A data record carrier made by the method of any one of claims 1 to 19.

40. A data record carrier made by the method of any one of claims 20 to 38.

41. A data record carrier without timing or synchronization data including a substrate and digital data on the substrate in the form of a plurality of arcuate tracks of cells on said substrate with each track being spaced from an adjacent track by a predetermined distance at a point intermediate the ends of each track and each track having the same radius throughout the arcuate path of said track such that the tracks extend in an arcuate manner across the data record carrier with each track having the same radius and being arranged in a nested manner relative to adjacent tracks along a common centerline, one bit of data (0 or 1) being stored in each cell, each cell having the same cell length in the direction of the track and the same cell width in a direction transverse to the direction of the track, and each cell for one form of logic (0 or 1) being a non-transition cell and each cell for the other form of logic (1 or 0) being a transition cell.

42. The data record carrier of claim 41 wherein each non-transition cell includes a fully transmissive area or a fully non-transmissive area and each transition cell includes a transmissive area over part of the cell extending transverse to the direction of the track and a non-transmissive area over the other part of the cell extending transverse to the direction of the track.

43. The data record carrier of claim 42 wherein said substrate is made of photosensitive material and said transmissive areas are transparent and said non-transmissive areas are opaque.

44. The data record carrier of claim 41 wherein each non-transition cell includes a fully reflective surface or a fully non-reflective surface and each transition cell includes a reflective surface over part of the cell extending transverse to the direction of the track and a non-reflective surface over the other part of the cell extending transverse to the direction of the track.

45. The data record carrier of claim 44 wherein said substrate is made of a paper material.

46. The data record carrier of claim 44 wherein the transition between reflective and non-reflective surface areas in each transition cell is located approximately half way across the length of each transition cell.

47. The data record carrier of claim 41 wherein the non-occurrence of a transition over the length of a cell establishes the logic of a non-transition cell (0 or 1) and the occurrence of a transition over the length of a transition cell establishes the logic of the cell (1 or 0) whereby high accuracy in the cell edges or high accuracy in the position of the transition in the transition cells is not required.

48. The data record carrier of claim 41 wherein the cell edges or the position of the transition of a cell or the sharpness of either can vary up to at least 25% of the desired intended location (position along the track) of such cell edge or position of transition with the data still being highly readable.

49. The data record carrier of claim 41 wherein said substrate is approximately 4 inches by 6 inches in length.

50. The data record carrier of claim 41 wherein the length of each cell in the direction of the track is between 0.002 inch and 0.020 inch.

51. The data record carrier of claim 50 wherein said cell length is approximately 0.006 inch.

52. The data record carrier of claim 41 wherein the width dimension of each cell in a direction transverse to the direction of the track is between 0.003 inch and 0.010 inch.

53. The data record carrier of claim 52 wherein said cell width dimension is approximately 0.006 to 0.008 inch.

54. The data record carrier of claim 41 wherein each track is an arcuate track having a given radius that is constant for the length of the arcuate track.

55. The data record carrier of claim 41 wherein said constant radius of each arcuate track is between 4 inches and 18 inches.

56. The data record carrier of claim 41 wherein said constant radius of each track is approximately 8 to 12 inches.

57. The data record carrier of claim 41 wherein the spacing between adjacent tracks is 0.001 to 0.002 inch less than the thickness of each track.

58. The data record carrier of claim 57 wherein each track has a thickness of approximately 0.006 to 0.008 inch.

59. The data record carrier of claim 41 wherein each track extends between 30° and 120° of arc.

60. The data record carrier of claim 58 wherein each said track extends approximately 60° of arc.

61. The data record carrier of claim 60 wherein at least 45° of arc of each track contains information data.

* * * * *